United States Patent
Srinivasan et al.

(10) Patent No.: US 9,914,998 B2
(45) Date of Patent: Mar. 13, 2018

(54) SYNTHESIS OF SILICON CONTAINING MATERIALS USING LIQUID HYDROSILANE COMPOSITIONS THROUGH DIRECT INJECTION

(71) Applicant: NDSU RESEARCH FOUNDATION, Fargo, ND (US)

(72) Inventors: Guruvenket Srinivasan, Fargo, ND (US); Robert A. Sailer, West Fargo, ND (US); Justin Hoey, Fargo, ND (US)

(73) Assignee: NDSU RESEARCH FOUNDATION, Fargo, ND (US)

( * ) Notice: Subject to any disclaimer, the term of this patent is extended or adjusted under 35 U.S.C. 154(b) by 17 days.

(21) Appl. No.: 14/853,462

(22) Filed: Sep. 14, 2015

(65) Prior Publication Data
US 2016/0068954 A1    Mar. 10, 2016

Related U.S. Application Data

(63) Continuation of application No. PCT/US2014/029451, filed on Mar. 14, 2014.
(Continued)

(51) Int. Cl.
*C23C 16/24* (2006.01)
*C23C 16/448* (2006.01)
(Continued)

(52) U.S. Cl.
CPC ........ *C23C 16/4486* (2013.01); *C09D 183/16* (2013.01); *C23C 16/0209* (2013.01);
(Continued)

(58) Field of Classification Search
None
See application file for complete search history.

(56) References Cited

U.S. PATENT DOCUMENTS 5,656,329 A * 8/1997 Hampden-Smith ... C23C 16/409
257/E21.272
6,045,864 A    4/2000 Lyons et al.
(Continued)

FOREIGN PATENT DOCUMENTS

JP    8169708    7/1996
JP    2010135579 A    6/2010

OTHER PUBLICATIONS

Korea Intellectual Property Office (KIPO), International Search Report and Written Opinion, PCT/US2014/029451, dated Mar. 14, 2014, pp. 1-16, with claims searched, pp. 17-19, counterpart to the application filed herein.
(Continued)

*Primary Examiner* — Mandy Louie
(74) *Attorney, Agent, or Firm* — O'Banion & Ritchey LLP; John P. O'Banion

(57) ABSTRACT

An apparatus and a non-vapor-pressure dependent method of chemical vapor deposition of Si based materials using direct injection of liquid hydrosilane(s) are presented. Liquid silane precursor solutions may also include metal, non-metal or metalloid dopants, nanomaterials and solvents. An illustrative apparatus has a precursor solution and carrier gas system, atomizer and deposit head with interior chamber and a hot plate supporting the substrate. Atomized liquid silane precursor solutions and carrier gas moves through a confined reaction zone that may be heated and the aerosol and vapor are deposited on a substrate to form a thin film. The substrate may be heated prior to deposition. The deposited film may be processed further with thermal or laser processing.

9 Claims, 6 Drawing Sheets

Related U.S. Application Data

(60) Provisional application No. 61/787,104, filed on Mar. 15, 2013.

(51) Int. Cl.
    *C23C 16/34*    (2006.01)
    *C23C 18/02*    (2006.01)
    *C23C 18/12*    (2006.01)
    *C09D 183/16*   (2006.01)
    *C23C 16/02*    (2006.01)
    *C23C 16/56*    (2006.01)
    *H01L 21/02*    (2006.01)
    *C08G 77/60*    (2006.01)

(52) U.S. Cl.
    CPC ............ *C23C 16/24* (2013.01); *C23C 16/345* (2013.01); *C23C 16/56* (2013.01); *C23C 18/02* (2013.01); *C23C 18/122* (2013.01); *C23C 18/1204* (2013.01); *C23C 18/127* (2013.01); *C23C 18/1258* (2013.01); *C23C 18/1291* (2013.01); *H01L 21/0259* (2013.01); *H01L 21/0262* (2013.01); *H01L 21/02118* (2013.01); *H01L 21/02532* (2013.01); *H01L 21/02592* (2013.01); *C08G 77/60* (2013.01)

(56) References Cited

U.S. PATENT DOCUMENTS

| | | | |
|---|---|---|---|
| 6,244,575 B1 * | 6/2001 | Vaartstra | C23C 16/4486 118/708 |
| 7,314,513 B1 * | 1/2008 | Zurcher | H01L 21/02532 106/287.14 |
| 8,530,589 B2 | 9/2013 | Scher | |
| 2003/0215644 A1 | 11/2003 | Deshpande et al. | |
| 2005/0158448 A1 * | 7/2005 | McNeish | B05B 17/0623 427/2.1 |
| 2008/0009126 A1 | 1/2008 | Aslami et al. | |
| 2008/0268165 A1 | 10/2008 | Fekety et al. | |
| 2010/0009095 A1 | 1/2010 | Ward et al. | |
| 2010/0255664 A1 * | 10/2010 | Khandekar | H01L 21/02422 438/488 |

OTHER PUBLICATIONS

Japanese Patent Office (JPO), Office Action dated Oct. 31, 2017, related Japanese patent application No. 2016-503100, pp. 1-4, English-language translation, pp. 5-8, claims examined, pp. 9-11.

* cited by examiner

SYNTHESIS OF SILICON CONTAINING MATERIALS USING LIQUID HYDROSILANE COMPOSITIONS THROUGH DIRECT INJECTION

CROSS-REFERENCE TO RELATED APPLICATIONS

This application is a 35 U.S.C. § 111(a) continuation of PCT international application number PCT/US2014/029451 filed on Mar. 14, 2014, incorporated herein by reference in its entirety, which claims priority to, and the benefit of, U.S. provisional patent application Ser. No. 61/787,104 filed on Mar. 15, 2013, incorporated herein by reference in its entirety. Priority is claimed to each of the foregoing applications.

The above-referenced PCT international application was published as PCT International Publication No. WO 2014/144862 on Sep. 18, 2014, which publication is incorporated herein by reference in its entirety.

STATEMENT REGARDING FEDERALLY SPONSORED RESEARCH OR DEVELOPMENT

This invention was made with Government support under DE-FG36-08G088160 awarded by the United States Department of Energy. The Government has certain rights in the invention.

INCORPORATION-BY-REFERENCE OF COMPUTER PROGRAM APPENDIX

Not Applicable

BACKGROUND OF THE INVENTION

1. Field of the Invention

This invention pertains generally to synthesis schemes and methods for producing silicon based thin film nanostructures and materials, and more particularly to compositions and methods for synthesis of silicon-based materials using liquid hydrosilane(s).

2. Description of Related Art

Silicon is one of the most abundant materials available in the earth in the form of silicates. Pure elemental silicon is an indirect-band gap semiconductor that is widely used in applications ranging from photovoltaic to microelectronic devices. Despite the arrival of several direct band-gap compound semiconductors, Si remains the material of choice due to its ready availability and simple processing. Bulk Si finds application in technologies such as c-Si solar cells, but Si in its thin film form is more widely used.

Thin films of Si are generally obtained by cracking or decomposing gaseous silicon precursors such as mono, di and tri silanes ($SiH_4$, $Si_2H_6$, $Si_3H_8$) or silicon tetrachloride/fluoride with a suitable reducing atmosphere at elevated temperatures. The addition of plasma to CVD helps to decrease the processing temperature and increase the deposition rate. Silicon in thin film form can be deposited as amorphous, polycrystalline, nano-crystalline or in mixed phases depending on the process parameters that are used. Alternately Si thin films can be obtained from physical vapor deposition methods such as magnetron sputtering, cathodic arc, etc. However, the lower deposition rate associated with these processes limits their application. Due to the lower deposition efficiencies associated with the gaseous silanes (10-20% in PECVD with $SiH_4$), large volumes of gases used in the manufacturing processes are stored in cylinders.

Silane is also extremely pyrophoric and ignites spontaneously in air even at concentrations as low as 2-4%. When used in combination with other gas(es) such as hydrogen, oxygen, nitrogen or ammonia, the hazard level increases. Such hazards associated with silanes in gaseous form demand complicated gas-handling systems with advanced safety features to reduce the hazard of fire and explosion.

Growing consumer demand for electronic products such as thin film transistor (TFT) based flat panel displays, Photovoltaic cells, etc., drives the demand for alternate processes and Si sources for silicon thin films to further decrease the cost of production. State-of-the-art manufacturing technology for Si-based electronic devices relies on vacuum processes which are difficult to implement with roll-to-roll production techniques. Low conversion efficiencies of $SiH_4$ to Si thin films and the difficulties associated with handling pyrophoric silane gases are other factors increasing the cost of manufacturing with gaseous silanes. High order silane gases such as disilane ($Si_2H_6$), trisilanes ($Si_3H_8$) and tetrasilanes ($Si_4H_{10}$) are shown to improve deposition efficiencies, but the issues with gas handling still remain a challenge.

Liquid silane sources such as cyclopentasilane ($Si_5H_{10}$, CPS) and cyclohexasilane ($Si_6H_{12}$, CHS) provide an opportunity to deposit thin films of Si at ambient conditions with solution based processes such as spin coating, spray coating etc., which can be cost-effective for large scale production of electronics. Liquid hydrosilanes can be used as the precursor for silicon containing films and materials using chemical vapor deposition. Liquid hydrosilanes are easier to handle than gaseous silanes. These liquid silane precursors have been shown to produce films at higher deposition rates and relatively low temperatures compared with other gaseous silanes. However, liquid hydrosilanes may have lower-vapor pressure resulting in difficult vaporization and transportation in the vapor phase. In addition, prolonged exposure to heat and light radiation initiates polymerization in liquid silane, further reducing its vapor-pressure and the flow rate of the vapor. This can lead to large inconsistencies in the deposition process over time.

Several scientific challenges in utilizing the wet-chemical processes that govern the growth of Si thin films remain. For example, the extent of UV-induced polymerization, viscosity, and wettability of liquid silanes on different surfaces are parameters known to play a vital role in solution based processing. One difficulty observed with the use of liquid silanes is feed line clogging during the transportation neopentasilane vapor to a CVD reactor using standard techniques. Accordingly, there is a need for an alternative to conventional methods for producing silicon thin films that use hazardous gases as well as alternatives to the standard vacuum CVD/PECVD and spin coating processes. The present invention satisfies these needs, as well as others and is a significant improvement in the art.

BRIEF SUMMARY OF THE INVENTION

The present invention provides an apparatus and methods for silicon thin film synthesis preferably using aerosolized cyclohexasilane (CHS, $Si_6H_{12}$) or cyclopentasilane (CPS, $Si_5H_{10}$) or other liquid silane compositions at atmospheric pressure.

One problem with chemical vapor deposition processes is the initiation of polymerization of the silane by the thermal cycling of $Si_6H_{12}$ in a bubbler leading to a decrease in the vapor pressure causing variations in the deposition rate. In order to overcome this issue, the liquid silane is aerosolized and injected into a hot zone to vaporize the liquid silane which is then transported to a reaction zone and thin films of Si are deposited on the substrate of interest. Generally, the liquid hydrosilane is injected directly with a gas and this mixture is transported to a reaction zone where the hydrosilane reduces to form Si based materials.

The preferred apparatus has a flow of input gas such as nitrogen, helium or argon from a source of gas or gases to an atomizer. An intake port to the gas input allows injection of precursor solution into the gas stream. The injection of precursor solution can be introduced at a defined rate by a syringe pump. The injected precursor solution is aerosolized by the atomizer and the droplets are directed to a chamber that has one end open to a substrate. A second carrier gas source may be used to maintain the flow of droplets through the chamber. In one embodiment, the chamber has a heating element that can create a zone of controlled temperature in the chamber. In another embodiment, the second carrier gas or gases is pre-heated so that the atomized droplets are heated by the gas and vaporized.

In one embodiment, the bottom of the chamber has a bottom that has channels, slots, ducts or a screen or mesh to provide spatial control over the deposition of droplets/vapor on the substrate. The bottom of the chamber may also have openings that form a pattern or design.

The substrate is exposed on a hotplate or other heating element to liquid silane composition disposed on the substrate to form amorphous or crystalline or combinations thereof of silicon materials. Laser irradiation may be used to crystallize the silicon. With post deposition processing, the microstructure of the Si thin films or microstructure can be changed substantially over existing techniques.

According to one aspect of the invention, a method is provided for synthesis of amorphous or crystalline Si thin films using the combination of aerosol deposition, heating and laser annealing at atmospheric pressure.

According to another aspect of the invention, a method is provided for depositing degenerately doped Si thin films (n-Si and p-Si) by adding suitable dopant molecules with $Si_6H_{12}$ or $Si_5H_{10}$ solutions.

Another aspect of the invention is to provide an apparatus and method for producing dense Si-nanowires at atmospheric pressure using an aerosol assisted atmospheric pressure chemical vapor deposition process.

A further aspect of the invention is to provide an apparatus and method that is efficient, is not dependent on toxic gases, and can be used with roll-to-roll fabricating techniques.

Further aspects of the invention will be brought out in the following portions of the specification, wherein the detailed description is for the purpose of fully disclosing preferred embodiments of the invention without placing limitations thereon.

BRIEF DESCRIPTION OF THE SEVERAL VIEWS OF THE DRAWING(S)

The invention will be more fully understood by reference to the following drawings which are for illustrative purposes only:

DETAILED DESCRIPTION OF THE INVENTION

Referring more specifically to the drawings, for illustrative purposes embodiments of the apparatus and methods for producing Si thin films using atomized liquid silane compositions of the present invention are described and depicted generally in FIG. 1 through FIG. 7. It will be appreciated that the methods may vary as to the specific steps and sequence and the apparatus may vary as to structural details without departing from the basic concepts as disclosed herein. The method steps are merely exemplary of the order that these steps may occur. The steps may occur in any order that is desired, such that it still performs the goals of the claimed invention.

Figure 1:
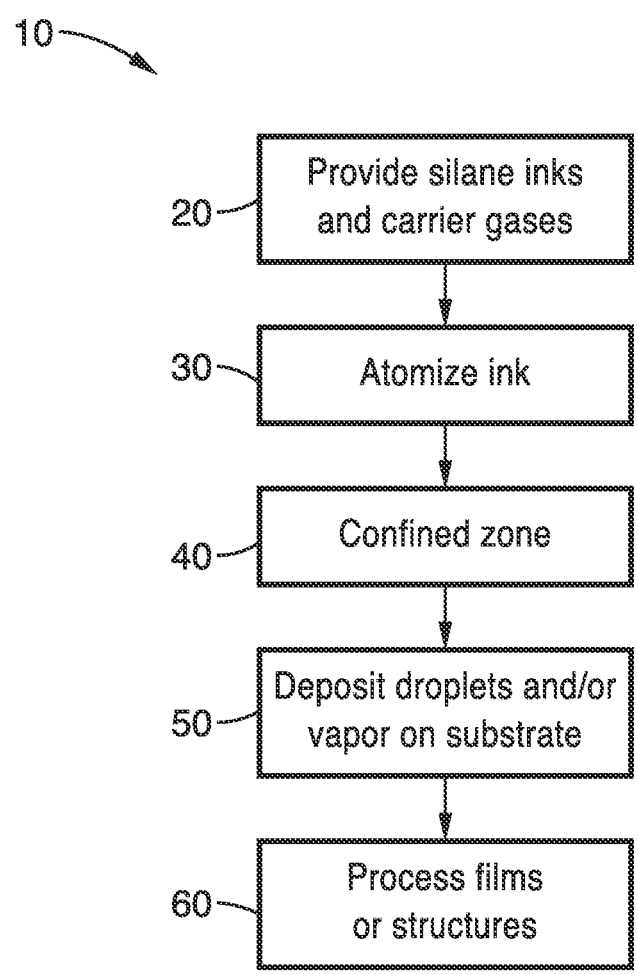
FIG. 1 is a schematic flow diagram of one process for forming silicon nanostructures according to one embodiment of the invention.

Turning now to FIG. 1, a flow diagram of one embodiment of a method 10 for producing aerosol assisted deposition of Si thin films is shown. In the step at block 20, the liquid silane inks and carrier gas or gases are selected and obtained. At block 20, a silane compound of formula, $Si_xH_y$, where x is from 3 to 20, and y is 2x or (2x+2) is selected and acquired. Liquid cyclosilanes (i.e., $Si_nH_{2n}$) such as cyclohexasilane $(Si_6H_{12})$ or cyclopentasilane, $(Si_5H_{10})$ and linear or branched silanes (i.e., $Si_nH_{2n+2}$) are particularly preferred as a base silane ink. Using a liquid precursor makes the manufacturing of electronic devices similar to inkjet printing, where the precursor molecules can act as ink materials. A synthetic route to liquid cyclohexasilane, where a reaction of $HSiCl_3$ with a triamine gives a salt, $Si_6C_{14}^{2-}$ that is readily reduced to $Si_6H_{12}$, is preferred. Cyclohexasilane undergoes ring-opening polymerization under heat or prolonged exposure to UV laser light with additional thermal treatment transforming the solid polydihydrosilane —$(SiH_2)_n$— into first a-Si and then crystalline silicon materials.

In another embodiment, the silane or silanes selected and acquired at block 20 also includes a metal, non-metal or metalloid dopant, or other additive composition to give the final film with certain characteristics. A wide variety of metal and non-metal additive compositions can qualify. Additive compositions can be used alone or in combination with one or more other additive compositions.

Preferred metal additives include P, B, Sb, Bi, or As and typical non-metal or metalloid additives include elements from group IIIA, IVA or VA. In particular, metal, non-metal, or metalloid elements and combinations include Ti, V, Cr Mn, Fe, Co, Ni, Zn, Ga, Ge, As, Zr, Nb, Mo, Tc, Ru, Rh, Pd, Ag, Cd, In, Sn, Sb, Hf, Ta, W, Re, Os, Ir, Pt, Au, Hg, TI, Pb, Bi, Al, Si, P, B.

In one embodiment, the liquid hydrosilane composition also contains one or more nanomaterials. Nanomaterials that are part of the ink are nano-scale objects with at least one dimension of length between 1 nm and 100 nm. The nanomaterials can be of any shape including but not limited to spherical, cylindrical, conical, tubular, and combinations thereof. The nanomaterial can be single-crystalline, polycrystalline, amorphous and combinations thereof. The composition of the said nanomaterial(s) may also contain more than one element including Si. (e.g., Si, $SiO_2$, CdS, CdTe, Ge, SiGe, other oxides, metals, or metal oxides, etc.).

Optionally, the precursor ink can include a solvent provided at block 20 of FIG. 1. The solvent may be a solid, liquid or gas, but is preferably a liquid or gas. The solvent is defined as a material that dissolves a solute to form a solution without chemically changing the solute. Preferred solvents include cyclooctane and toluene. Other solvents include xylene, 1,2,4-trichlorobenzene, dichloromethane and mixtures thereof. The selection of the solvent will be influenced by the selection of the silane and dopant for the final precursor ink composition.

Carrier or sheath gases that are selected at block 20 are preferably gases that do not react with the silane inks or their reaction products. Preferred gases include $N_2$, He and Ar alone or in combination.

The ink selected at block 20 is injected/aerosolized/atomized at block 30 of FIG. 1 to produce droplets that can be carried by carrier gas(es). In one embodiment, the ink is injected into a stream of gas and directed through an atomizer nozzle.

The liquid hydrosilane compositions may be injected controllably through a non-vapor-pressure dependent method using a controllable mechanical injector such as a syringe or other pump. The liquid hydrosilane compositions that are injected go through an aerosolizer to form an aerosol (liquid droplets suspended in a gas) in a controllable, non-vapor-pressure dependent way. The aerosolizer can be ultrasonic, pneumatic, mechanical, electrostatic or combinations thereof that may function individually and/or simultaneously, in-series or in combination. Aerosolization may also involve the addition of flowing gases.

The droplets that are produced are directed through at least one confined zone at block 40 of FIG. 1 for a preliminary treatment. The rate of flow of the droplets through the zone can be regulated. In one embodiment, the confined zone may include additional mechanism(s) to mix the contents in the zone including aerodynamic, acoustic, and mechanical.

The confined zone(s) can be of any shape and be kept at any temperature or temperature distribution greater than, less than, or equal to that of the liquid hydrosilane compositions. In one embodiment, the confined zone is heated with a heating element to a range of temperatures. In another embodiment, the carrier gases are heated so that the confined zone is also heated as the gases flow through. The temperature of the confined zone may be maintained at levels that result in the evaporation of solvents that may optionally be part of the ink. In one embodiment, the liquid silane aerosol is heated to a temperature between 150° C. and 250° C.

In another embodiment, secondary gases can be added to the liquid hydrosilane stream, liquid hydrosilane aerosol droplets and combinations thereof in the confined zone. These secondary gases can be inert, reactive or combinations of the two gases. Secondary gas can be heated, cooled, or combinations thereof. The secondary gas can contain a vapor of liquid, vapor of solid and combinations thereof from an additional precursor containing elements including Si. The secondary gas may also contain nanoparticles in an alternative embodiment. The composition of the nanomaterial(s) may also contain more than one element including Si (e.g., Si, $SiO_2$, CdS, CdTe, Ge, SiGe, other oxides, metals, or metal oxides, etc.).

In another embodiment, the confined zone may include additional mechanisms to mix the content of the chamber including aerodynamic, acoustic, and mechanical mixers.

At block 50, the liquid silane passes through the confined zone and is deposited on a substrate. The liquid hydrosilane exiting the confined zone can be a vapor, aerosol (liquid in gas, solid in gas or combinations thereof). In one embodiment, the liquid hydrosilane composition droplets or vapor exiting the confined zone is transported through an exit channel. The exit channel can have a variety of different geometries including cylindrical, narrow-slit, shower-head type or combinations of openings. The bottom of the confined zone can be open or may also have a grid, mesh structure, or a pattern. The bottom of the confined zone may also be heated, cooled, or both.

The hydrosilane composition droplets and/or vapor exiting the confined zone are deposited on a substrate at block 50 to produce a film of a thickness that can be controlled. The droplets can also coat a structure or form nanostructures such as nanowires.

At block 60, the deposited material forming a film or other structure can be processed further to produce a final product. In one embodiment, the substrate is maintained at a temperature from 0° C. to 1200° C., preferably from 25° C. to 600° C., and most preferably from 300° C. to 500° C.

In another embodiment, the substrate is traversed by the apparatus head at a given velocity to produce silicon films with chosen properties. The velocity may be from 0.1 to 1000 mm/second.

In a further embodiment, the film is deposited on the substrate at temperatures between 300° C. to 500° C. for a period of time to produce amorphous silicon and then exposed (post-deposition) to laser irradiation to form crystalline silicon.

Figure 2:
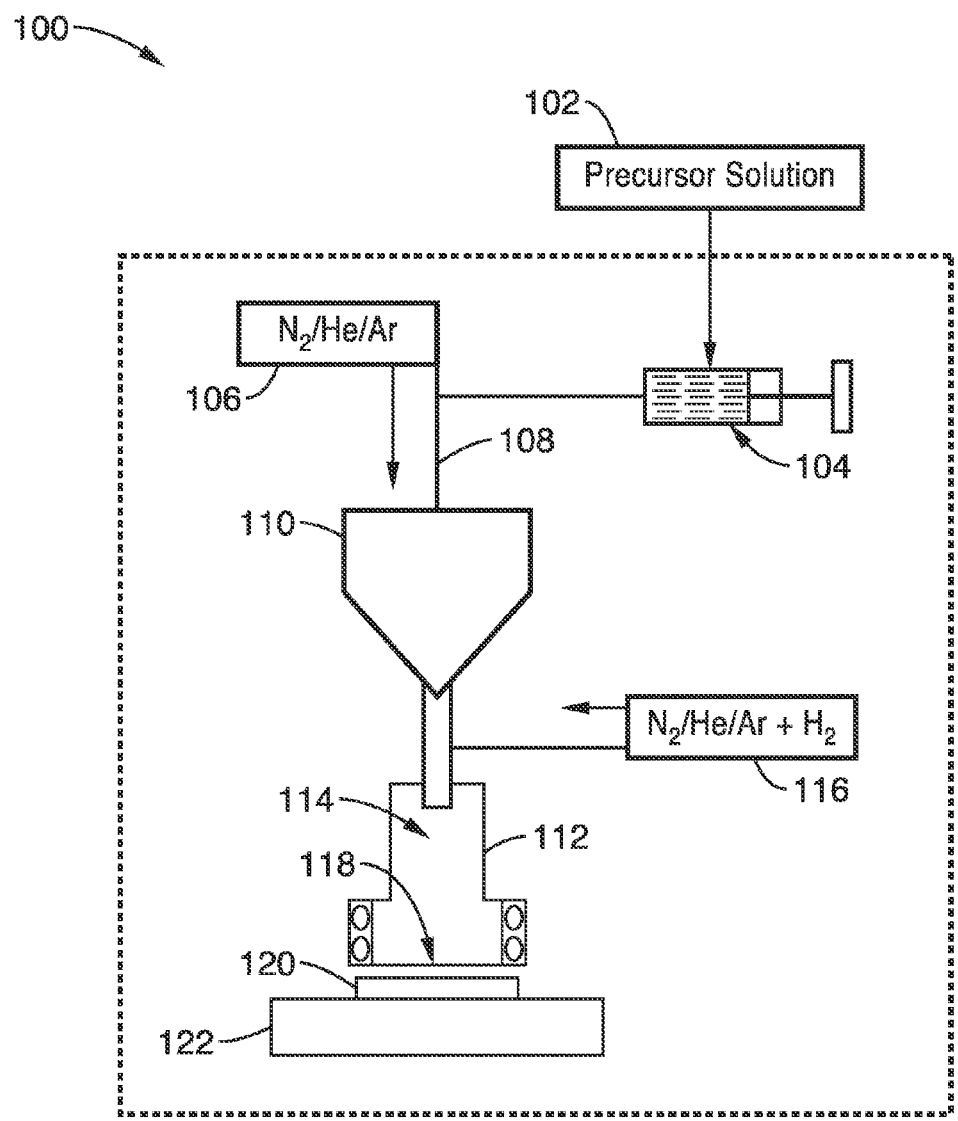
FIG. 2 is a schematic representation of an apparatus for aerosol assisted atmospheric pressure chemical vapor deposition according to one embodiment of the invention.

Turning now to FIG. 2, a schematic representation of one embodiment 100 of an apparatus for forming silicon films on a substrate is shown. A precursor solution of liquid silane(s) 102 is prepared and placed into a fluid injector 104 that may be a syringe or pump. The feed rate of the precursor solution can be maintained at a constant or variable rate using the fluid injector pump 104.

The fluid injector 104 is connected to an input duct 108 and a source of carrier gas 106. In the embodiment shown in FIG. 1, the carrier gas may be nitrogen, helium or argon, individually or in a combination of inert gases. The input 108 is coupled to an atomizer 110 that produces a flow of atomized droplets, vapor and carrier gases to a deposition head 112 that has a cylindrical interior 114 forming a confined zone and an output 118.

A source of secondary gas 116 is provided to the output channel from the atomizer 110. The secondary gas 116 that flows may be pure or may be a mixture of gases such as Ar, He, $N_2$, and $H_2$ in this illustration. The addition of the secondary gas 116 increases the vaporization of the liquid silane aerosol droplets, which are then transported through a cylindrical shower head 112.

The deposition head 112 may optionally include a heating or cooling element so that the interior 114 can be maintained at a desired temperature or to increase or decrease the temperature at the bottom of the head 112. The secondary gas 116 or carrier gas 106 may also be pre-heated from the source before introduction into the apparatus.

The output 118 can include channels or ducts or a mesh. The silane drops and/or vapor is then transported out of the output 118 of the head 112 to the substrate 120. In the embodiment shown, the substrate 120 is disposed on a heating element 122. The temperature of the substrate 120 when exposed to the silanes from head 112 can be controlled by the heating element 122.

The deposited film 120 can also be subjected to additional post deposition treatments such as additional heating or cooling cycles as well as laser or chemical treatments to produce the final film.

The substrate 120 may contain a catalyst that may react with silane to form Si nanostructures. The said catalyst is preferably a metal that may be in the form of thin film or nanocrystals.

The invention may be better understood with reference to the accompanying examples, which are intended for purposes of illustration only and should not be construed as in any sense limiting the scope of the present invention as defined in the claims appended hereto.

EXAMPLE 1

In order to demonstrate the operational principles of the apparatus and synthesis methods, an apparatus was constructed having the features shown schematically in FIG. 2. A solution of 10 vol. % cyclohexasilane ($Si_6H_{12}$, CHS) in cyclooctane and 10 vol. % cyclopentasilane ($Si_5H_{10}$, CPS) was selected as the liquid hydrosilane precursor ink. The ink was injected into a Sono-Tek™ nozzle (atomizer) that is driven by an ultrasonic frequency generator at 120 kHz. A Gas ($Ar/He/N_2$) flowing at 300 sccm to 1000 sccm was used as the carrier gas to carry the aerosol (liquid mist). An additional secondary gas ($Ar/He/N_2$) at 1 lpm was introduced to increase the vaporization of the liquid silane aerosol droplets, which were then transported through a cylindrical shower head that was maintained at between 150-180° C. The distance between the shower head and heated platen was 2-5 mm. The shower head used for this experiment consists of 60, 1 mm diameter holes separated by 0.5 mm.

The substrate was a fused quartz square (1"×1") procured from Technical Glass, Inc. The substrates were cleaned prior to the deposition. Quartz substrates were coated with 200 nm thick $SiO_2$ to prevent trace level contamination diffusion from the substrate to the coatings. The feed rate of the precursor solution was maintained at 1.2 ml/h using a syringe pump. All other process parameters were maintained constant except the substrate temperature ($T_s$) which was varied between 300 to 500° C. in increments of 50° C. The experimental setup is placed in a $N_2$ filled glovebox with less than 1 ppm $O_2$ and $H_2O$.

Figure 3:
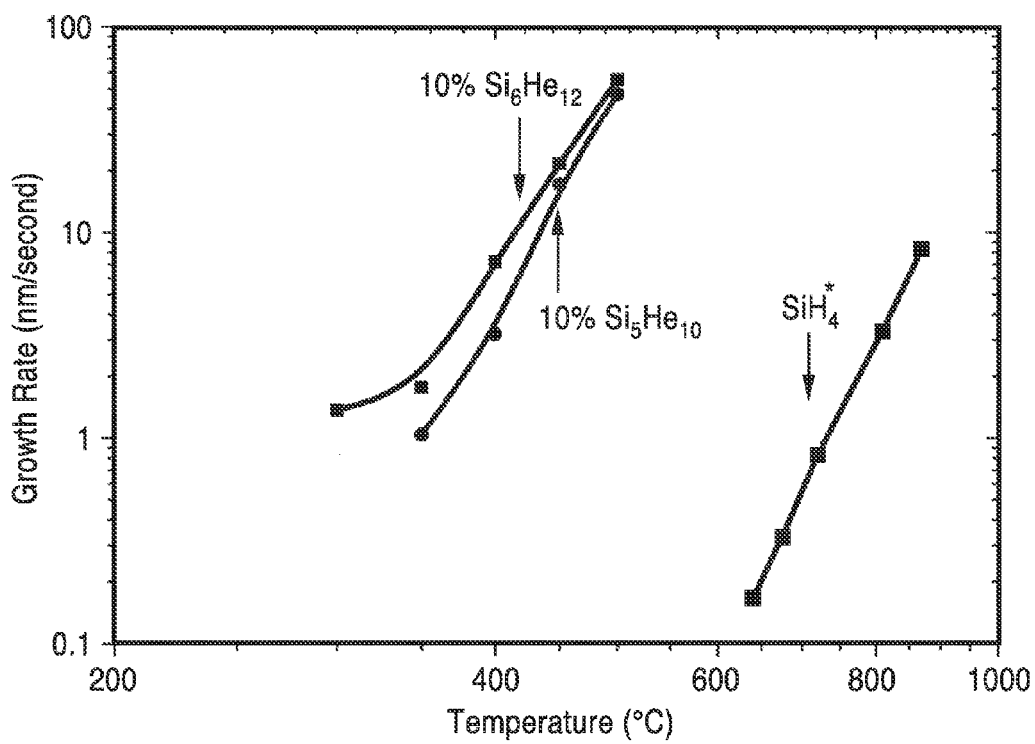
FIG. 3 is a graph of Si thin film growth rates obtained using the liquid silanes and a conventional gaseous silane.

The growth rate of several films produced by the apparatus were evaluated and compared to gaseous silane film rates. As shown in FIG. 3, the films using $Si_6H_{12}$ and $Si_5H_{10}$ as precursor inks had significantly higher growth rates compared to the gaseous silane film.

Thicknesses of the films were determined using VASE spectroscopic ellipsometry and contact profilometry. Microstructural properties of the Si thin films were evaluated using Raman spectroscopy with a Horiba Jobin Yvon LabRAM Aramis confocal imaging system with a 532 nm Nd:YAG laser. Conductivity of the films was measured using a 4-point probe, where a calibrated light source for AM1.5G was used to measure light conductivity.

The shower head was held stationary above the hot plate and deposition was carried out for a given time to get an appreciable thickness, typically between 3-20 minutes. Deposition rates at different substrate temperatures were determined from knowledge of film thickness and deposition time. Deposition rate vs. temperature for 10 vol. % $Si_6H_{12}$ in cyclooctane, and 10 vol. % $Si_5H_{10}$ in cyclooctane are shown in FIG. 3.

From the plot shown in FIG. 3, it can be seen that the Si thin film growth rates obtained using the liquid silanes are 1-2 orders of magnitude higher than those obtained using the gaseous silane counterpart. Interestingly, significant growth rates of silicon are realized at lower temperatures (250-300° C.) using $Si_6H_{12}$ and (300-350° C.) for $Si_5H_{10}$, and from the literature, $SiH_4$ does not form significant film thickness at the aforementioned temperature ranges.

Figure 4:
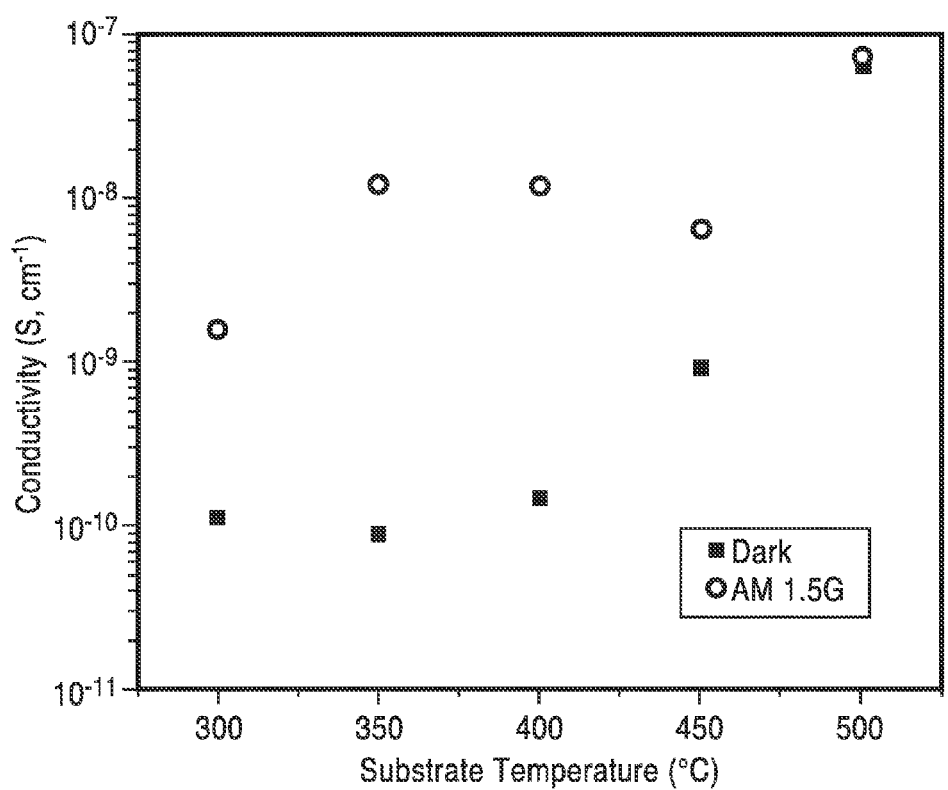
FIG. 4 is a graph of resistivities and electrical conductivities of deposited Si thin films using $Si_6H_{12}$.

To further illustrate the invention, the electrical properties of the Si thin films deposited using $Si_6H_{12}$ were evaluated and plotted. The graph of FIG. 4 summarizes the electrical conductivities of the Si thin films deposited using $Si_6H_{12}$ at different substrate temperatures. A calibrated AM1.5G illumination source was used to measure electrical properties under irradiation, while the sample stage was completely covered for dark measurements. All the films exhibited photoconductivity, with a maximum of a 3 order of magnitude difference in photoconductivity for Si thin films deposited at 400° C.

Figure 5:
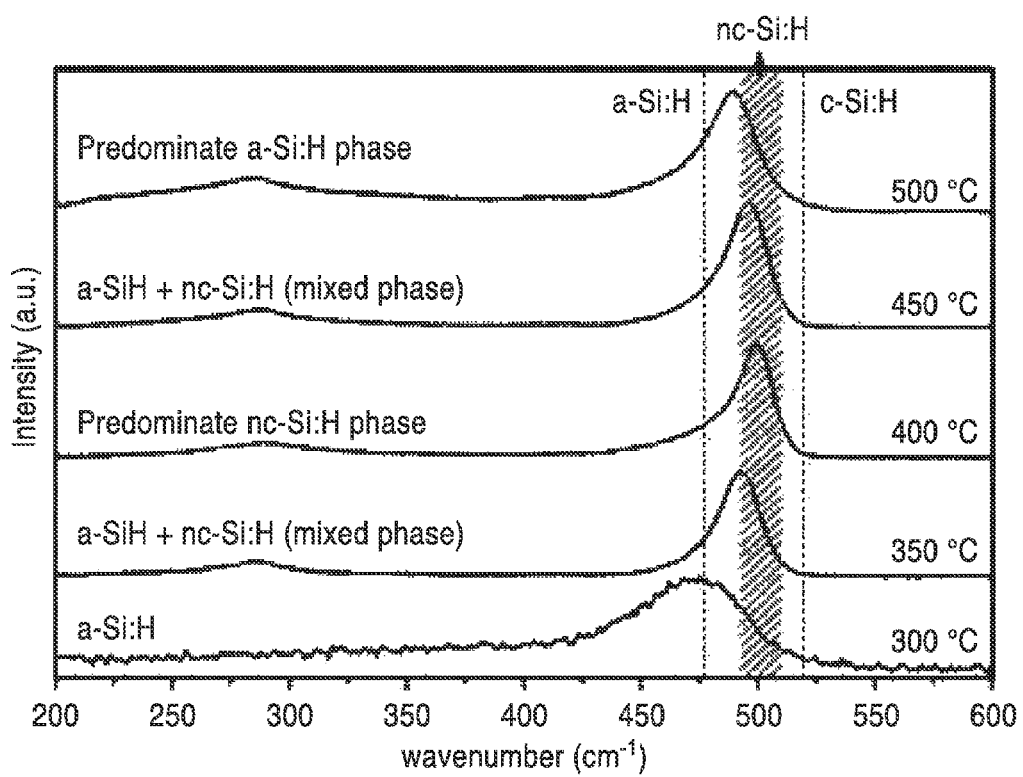
FIG. 5 is a plot of Raman Spectra of Si thin films at different deposition temperatures obtained using $Si_6H_{12}$.

The structural properties of the films were evaluated using Raman Spectroscopic analysis. The Raman analysis was performed on the Si thin films deposited using $Si_6H_{12}$ at various temperatures and is shown in FIG. 5. It can be seen that Si films deposited at 300° C. show a broad peak ~480 $cm^{-1}$ corresponding to a-Si:H. With an increase in temperature, a right shift in the peak position can be observed (towards ~500 $cm^{-1}$) until the temperature reaches 400° C. At this point the Si film is predominantly a nc-Si:H phase along with a-Si:H phase. As the temperature increases beyond 400° C., a left peak shift can be seen indicating predominantly a-Si:H phase present in the material. It can also be seen from FIG. 5 that as the temperature increases the deposition rate also increases significantly leading to higher concentration of silane molecules reaching the surface and hence the average energy (heat) available for the silane to decompose on the surface is less. This leads to more randomization in the film structure (i.e., amorphous).

EXAMPLE 2

To further demonstrate the methods, a cyclic hydrosilane, dopant precursor and solvent were used to produce a n-Si and p-Si thin film. Table 1 shows the $Si_6H_{12}$, solvent and the dopant concentrations used to prepare the precursor for n & p-type Si thin films.

The dopant elements are introduced to the $Si_6H_{12}$ solution by adding them either in their elemental or compound form that contains the dopant element ($P_4$ and tribenzyl-phosphorus ($PBn_3$), tribenzyl-antimony ($SbBn_3$) and tribenzyl-arsenic ($AsBn_3$)). This solution/source is then aerosolized and vaporized as previously described and Si thin films that contain the dopant element are deposited. The concentration of the dopant element can be varied by changing the concentration of the dopant or dopant containing compound in the parent precursor solution.

In a similar way, by adding decaborane ($B_{10}H_{14}$) or tribenzyborane ($BBn_3$) to $Si_6H_{12}$ or $Si_6H_{12}$ containing solution, p-type silicon thin films can be deposited. Table 2 depicts the concentration of dopants, $Si_6H_{12}$ and solution used to prepare 0.5 or 1 at. % doped Si precursor.

Doped Si thin films were deposited at 450° C. and 500° C., using the different precursor solutions (inks). Post deposition Si thin films were also subjected to laser annealing at 1200 mW to rapidly recrystallize the deposited Si thin films.

The electrical resistivity of the aforementioned films was determined using a four point probe. Table 2 summarizes the electrical resistivities of the degenerately doped Si thin films deposited using $Si_6H_{12}$ at different substrate temperatures before and after laser annealing.

The resistivity of the as-deposited doped Si depicts a value of about $1\times10^6$ Ω·cm for boron doped films indicating the dopants incorporated in the films are not electronically active, while a laser recrystallization process activates the dopants and hence a drastic decrease in the resistivity can be observed. Similarly, $PBn_3$ doped Si films showed higher resistivities which after laser annealing decreased drastically depicting dopant activation. As-deposited Si thin films with $P_4$ added with the $Si_6H_{12}$ showed significantly lower resistance compared to benzyl-P compounds exhibiting better dispersion and activation of P in the Si thin film matrix. Post laser annealing resistivities are in the order of $1\times10^{-1}$ to $1\lambda10^{-4}$ Ω·cm. This confirms the dopant atom activation. Similar results were obtained for arsenic (As) and antimony (Sb) doped Si thin films. The role of dopant concentration (in the parent precursor) on the properties of Si thin films deposited at different temperatures is being evaluated. Based on the experimental observations we suspect that the doped films deposited at different temperature(s) might yield films with superior properties without laser annealing.

Figure 6:
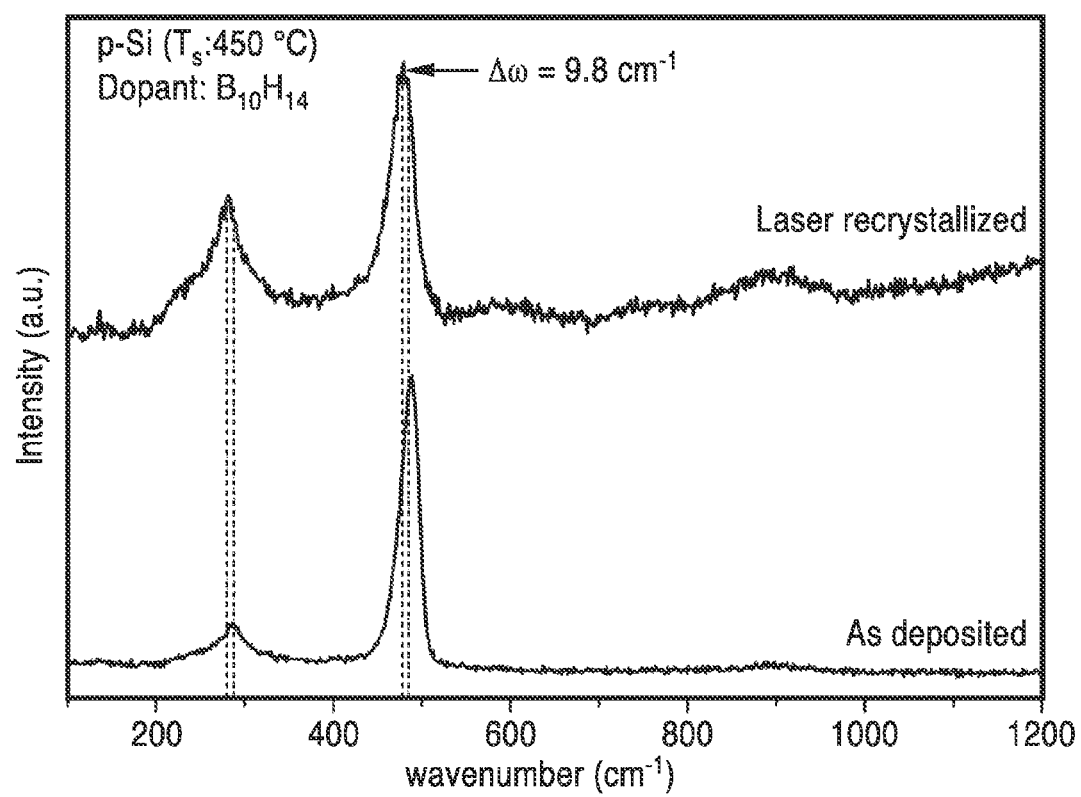
FIG. 6 is a plot of Raman Spectra of $B_{10}H_{14}$ doped Si thin films before and after laser annealing.

Raman Spectra of $B_{10}H_{14}$ doped Si thin films before and after laser annealing were also evaluated. The Raman spectroscopic analysis of the $B_{10}H_{14}$ doped as-deposited Si thin films and laser annealed films are shown in FIG. 6. It can be seen from the plot of FIG. 6, that the FWHM of the a-Si:H peak centered around 480 cm$^{-1}$ broadens as the result of laser annealing, while the peak at 290 cm$^{-1}$ showsan increase in intensity due to laser annealing. These results indicate the incorporation of boron in the Si—Si network as an active dopant which can contribute to electrical conduction via hole transport. Compositional examination of the films using X-ray florescence spectroscopy also demonstrated the incorporation of boron and phosphorus in the Si film supporting the electrical properties described previously.

EXAMPLE 3

To further demonstrate the methods, an alternative deposition scheme and apparatus to the shower-head that was used to uniformly distribute the silane composition on the hot plate to produce intrinsic Si and degenerately doped Si thin films was constructed and evaluated.

In this embodiment, a linear distributor that remains static is used to deposit while the hot-plate on which the substrate is placed beneath the linear distributor moves in a linear motion (quasi roll-to-roll). In addition, it was demonstrated that with changing concentration of dopant and the dopant chemical in the hydrosilane composition, the concentration of dopant in the Si thin film and hence the electrical properties can be controlled.

The liquid hydrosilane compositions that were assembled for producing degenerately doped Si contained a liquid hydrosilane ($Si_6H_{12}$ in this case), a solvent (toluene) and a dopant compound ($B_{10}H_{14}$ or $P_4$). The concentration of $B_{10}H_{14}/P_4$ was changed such that the B or P concentrations in the starting materials varied from 1 At. % to 10 At. %. The electrical properties of the as-deposited and annealed (tube furnace in Ar ambient at 800° C. for 1 hr.) were evaluated and are presented in FIG. 7 as a graph of conductivity of the Si thin films as a function of dopant concentration in the ink.

Figure 7:
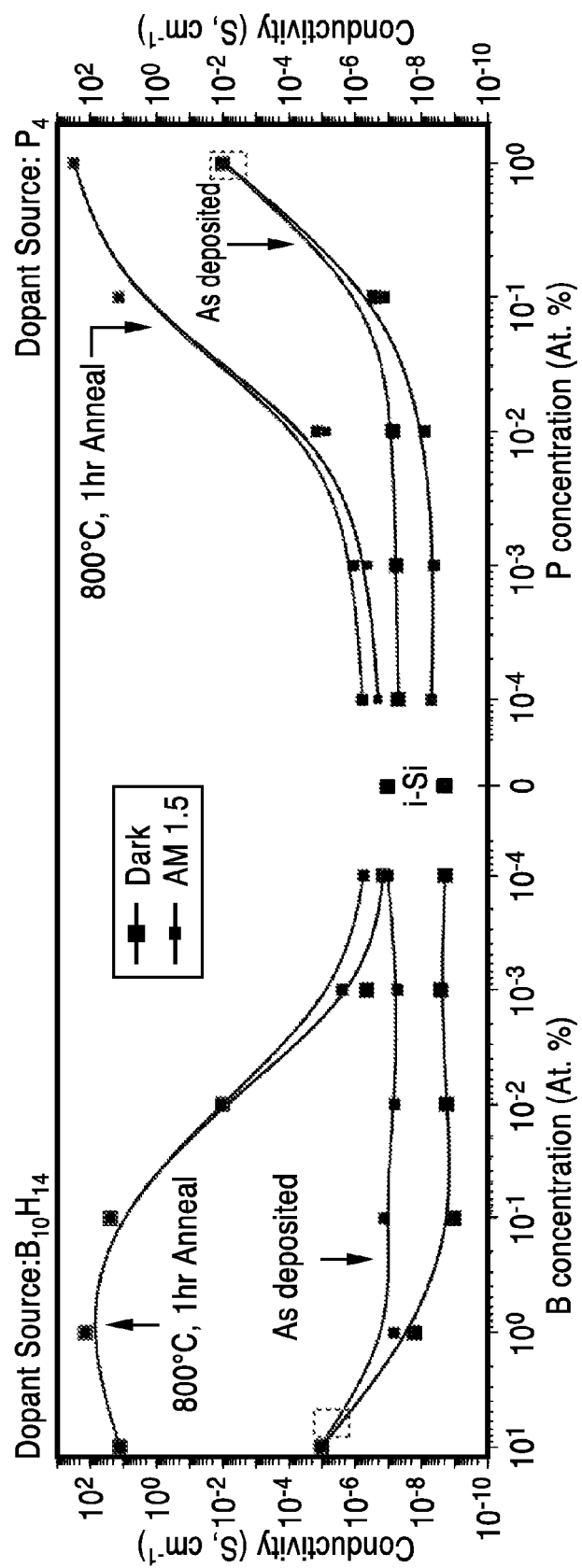
FIG. 7 is a graph of conductivity of Si thin films as a function of dopant concentration.

It can be observed from FIG. 7 that with an increase in the dopant concentration, the conductivity and photosensitivity (ratio or dark and light conductivity) of the films changes dramatically. These observations indicate that the concentration of dopant in the film incrementally changes with an increase in the concentration of the dopant material in the starting liquid hydrosilane composition. The increase in the conductivity with annealing shows the possible presence of electrically inactive dopants. The obtained electrical conductivity of degenerately doped and intrinsic thin films meets the requirements for a Si thin film solar cell. Extending this concept, a multilayered Si-thin film solar cell can be fabricated using the liquid-hydrosilane compositions.

EXAMPLE 4

Silicon nanowires (Si-NW) are used in wide spread applications including photovoltaic, Li-ion batteries, etc. Conventional synthesis of Si-NW's can be performed using several techniques, including catalytic assisted vapor-liquid-solid or vapor-solid-solid growth using CVD where a silane vapor is passed over a suitable catalyst at an appropriate temperature. The activation energy of the silane used and the eutectic temperature (of Si and the catalyst) determine the Si-NW growth rate and temperature. Monosilane ($SiH_4$) is widely used to synthesize Si-NWs at low-pressure using catalysts such as Au, Sn, Ni, Fe, Cu, etc. Moderate growth rates are observed due to the higher activation energy of $SiH_4$. Several problems limit large scale industrial production of Si-NW for many potential uses.

Another demonstration of the apparatus and methods was the synthesis of silicon nanowires (Si-NW) using liquid hydrosilane. The use of the apparatus with liquid silane inks enables the efficient growth of nanowires at moderate temperature(s) in a roll-to-roll fashion.

Nanowires were produced by dispersing copper (Cu) nanoparticles (using ultra-sonication) in isoproponol or ethyl alcohol and then spin coating SS blanks. The blanks were allowed to dry overnight at ambient conditions. The Cu particle coated SS blanks were used as a substrate. Si vapor was produced with the apparatus shown in FIG. 2 and applied to the spin coated blanks using $Si_6H_{12}$ inks. Depending on the growth temperature and concentration of $Si_6H_{12}$, Si-NWs with diameters varying from a few nanometers to a few hundred nanometers were obtained. The length of the Si-NW's ranged from a few microns to a few hundred microns. The yield of Si-NW's using $Si_6H_{12}$ was at least 5-6 times higher than any reported CVD process to date.

EXAMPLE 5

To further demonstrate the breadth of the invention, silicon nitride thin films were produced using liquid hydrosilane. Silicon nitride thin films are widely used as dielectric coatings in the microelectronic industry and as anti-reflective coatings for solar cells. The apparatus of FIG. 1 was used to deposit several $SiN_x$ thin films. A neat $Si_6H_{12}$ or 10 vol. % $Si_6H_{12}$ in toluene was injected through a Sono-tek atomizer, while a mixture of 9% (molar) ammonia ($NH_3$) in He (gas) was used as the sheath-gas. Intrinsic Si wafers were used as substrates and the substrate temperature was maintained between 400-500° C. The resulting films were examined using Fourier transform infrared spectroscopy (FTIR) to identify chemical bonds. FTIR spectra of $SiN_x$ thin film were obtained using 10% $Si_6H_{12}$ (in toluene) with $NH_3$ mixture flowing at 1.5 lpm, with a substrate temperature of 500° C. The presence of Si—N, N—H and Si—H vibrations in the FTIR demonstrated the formation of SiNx thin films.

From the discussion above it will be appreciated that the invention can be embodied in various ways, including but not limited to the following:

1. A method for synthesizing silicon thin films, comprising: atomizing a liquid silane to form an aerosol; heating the aerosol and a carrier gas to produce heated aerosol and vapor; depositing the heated aerosol and vapor onto a substrate to form a film; and transforming the deposited film.

2. A method as recited in any previous embodiment, further comprising heating the substrate to a temperature between 300° C. to 500° C. prior to depositing the heated aerosol on the substrate.

3. A method as recited in any previous embodiment, wherein the heating of liquid silane aerosol comprises heating the aerosol to a temperature between 150° C. and 250° C.

4. A method as recited in any previous embodiment, wherein the liquid silane is a silane selected from the group of silanes of the formula $Si_nH_{2n}$, $Si_nH_{2n+2}$ and $(—Si—)_n$.

5. A method as recited in any previous embodiment, wherein the liquid silane further comprises a solvent selected from the group of solvents consisting essentially of toluene, xylene, cyclooctane, 1,2,4-trichlorobenzene, dichloromethane and mixtures thereof.

6. A method as recited in any previous embodiment, wherein the liquid silane further comprises a dopant containing an element selected from the group of elements consisting of Ti, V, Cr Mn, Fe, Co, Ni, Zn, Ga, Ge, As, Zr, Nb, Mo, Tc, Ru, Rh, Pd, Ag, Cd, In, Sn, Sb, Hf, Ta, W, Re, Os, Ir, Pt, Au, Hg, Tl, Pb, Bi, Al, Si, P, B.

7. A method as recited in any previous embodiment, wherein the deposited film is transformed using thermal processing at temperatures from 150° C. to 300° C. to produce polysilane-containing materials.

8. The method recited in any previous embodiment, wherein the deposited film is transformed using thermal processing at temperatures from 300° C. to 700° C. to produce amorphous silicon-containing materials.

9. The method as recited in any previous embodiment, wherein the deposited film is transformed using thermal processing at temperatures from 700° C. to 1200° C. to produce crystalline silicon-containing materials.

10. A method for synthesizing silicon thin films, comprising: combining a liquid silane, a plurality of nanoparticles and a solvent to form a precursor ink; atomizing the precursor ink and a first carrier gas to form an aerosol; heating the aerosol and a carrier gases; depositing the heated aerosol onto a substrate to form a film; and transforming the deposited film.

11. A method as recited in any previous embodiment, further comprising: mixing a second carrier gas with the aerosol and first carrier gas to increase vaporization of liquid silane aerosol droplets.

12. A method as recited in any previous embodiment, wherein the liquid silane is a silane selected from the group of silanes of the formula $Si_nH_{2n}$, $Si_nH_{2n+2}$ and $(—Si—)_n$.

13. A method as recited in any previous embodiment, wherein the liquid silane further comprises a dopant.

14. A method as recited in any previous embodiment, wherein the heating of liquid silane aerosol comprises heating the aerosol to a temperature between 150° C. and 250° C.

15. A method as recited in any previous embodiment, wherein the solvent is selected from the group of solvents consisting of toluene, xylene, cyclooctane, 1,2,4-trichlorobenzene, dichloromethane and mixtures thereof.

16. A method as recited in any previous embodiment, further comprising heating the substrate to a temperature between 25° C. and 600° C. prior to depositing the heated aerosol on the substrate.

17. An apparatus for producing silicon thin films, comprising: a source of carrier gas and a source of precursor liquid silane fluidly coupled with an atomizer; and a deposit head body with an interior chamber coupled to an output of the atomizer, and one or more output ducts; wherein atomized liquid silane and carrier gas are emitted from the output ducts of the deposit head to a substrate.

18. The apparatus as recited in any previous embodiment, the deposit head further comprising: a heating or cooling element; and an input for a second carrier gas from a second source of carrier gas.

19. The apparatus as recited in any previous embodiment, further comprising: a substrate heating element.

20. The apparatus as recited in any previous embodiment, further comprising: an injector for controlling flow of a carrier gas and precursor ink to the atomizer.

Although the description above contains many details, these should not be construed as limiting the scope of the invention but as merely providing illustrations of some of the presently preferred embodiments of this invention. Therefore, it will be appreciated that the scope of the present invention fully encompasses other embodiments which may become obvious to those skilled in the art, and that the scope of the present invention is accordingly to be limited by nothing other than the appended claims, in which reference to an element in the singular is not intended to mean "one and only one" unless explicitly so stated, but rather "one or more." All structural, chemical, and functional equivalents to the elements of the above-described preferred embodiment that are known to those of ordinary skill in the art are expressly incorporated herein by reference and are intended to be encompassed by the present claims. Moreover, it is not necessary for a device or method to address each and every problem sought to be solved by the present invention, for it to be encompassed by the present claims. Furthermore, no element, component, or method step in the present disclosure is intended to be dedicated to the public regardless of whether the element, component, or method step is explicitly recited in the claims. No claim element herein is to be construed as a "means plus function" element unless the element is expressly recited using the phrase "means for". No claim element herein is to be construed as a "step plus function" element unless the element is expressly recited using the phrase "step for".

TABLE 1

| Type | $Si_6H_{12}$ | Toluene (µl) | Dopant Chemical | Vol. µl, (mg) | Dopant (at. %) |
|---|---|---|---|---|---|
| p | 0.48 g | — | $B_{10}H_{14}$ | 2.15 | ~1% |
| p | 47.9 mg | 580 | $BBn_3$ | (4.38) | ~1% |
| ni | 100 µl | 900 | $PBn_3$ | (10.10) | ~1% |
| n | 100 µl | 900 | $PBn_3$ | (4.99) | ~0.5% |
| n | 100 µl | 900 | $P_4$ | (1.94) | ~1% |
| n | 100 µl | 900 | $AsBn_3$ | (11.66) | ~1% |
| n | 100 µl | 900 | $SbBn_3$ | (13.18) | ~1% |

TABLE 2

| Type | Dopant | Substrate Temp (° C.) | Resistivity (Ω · cm) As deposited | Resistivity (Ω · cm) Laser Annealed |
|---|---|---|---|---|
| p | BBn$_3$ (9.6 at. %) | 450 | 2.07 × 10$^6$ | 9.84 |
| p | B$_{10}$H$_{14}$ (1 at. %) | 450 | 1.7 × 10$^5$ | 9.9 × 10$^{-4}$ |
| n | PBn$_3$ (1 at. %) | 450 | 6.4 × 10$^6$ | 1.65 |
| n | PBn$_3$ (1 at. %) | 500 | 5.8 × 10$^4$ | 1.41 × 10$^{-1}$ |
| n | P$_4$ | 450 | 3.7 × 10$^1$ * | 4.6 × 10$^{-3}$ |
| n | P$_4$ | 500 | 3.8 × 10$^{2*}$ | 8.4 × 10$^{-4}$ |
| n | AsBn$_3$ (1 at. %) | 450 | — | 6.7 × 10$^{-2}$ |
| n | AsBn$_3$ (1 at. %) | 500 | — | 3.0 × 10$^{-2}$ |
| n | SbBn$_3$ (1 at. %) | 450 | — | 1.2 × 10$^{-2}$ |
| n | SbBn$_3$ (1 at. %) | 500 | — | 1.6 × 10$^{-1}$ |

What is claimed is:

1. A method for synthesizing silicon thin films, comprising:
   atomizing a liquid silane to form an aerosol;
   heating the aerosol and a carrier gas to produce heated aerosol and vapor;
   depositing the heated aerosol and vapor onto a substrate to form a deposited film; and
   transforming the deposited film.

2. A method as recited in claim 1, further comprising heating the substrate to a temperature between about 300° C. to 500° C. prior to depositing the heated aerosol on the substrate.

3. A method as recited in claim 1, wherein said heating of liquid silane aerosol comprises heating the aerosol to a temperature between about 150° C. and 250° C.

4. A method as recited in claim 1, wherein said liquid silane is a silane selected from the group of silanes consisting of hydrosilanes of the formula Si$_n$H$_{2n}$, Si$_n$H$_{2n+2}$ and (—Si—)$_n$, where n is a number between 3 and 20.

5. A method as recited in claim 1, wherein said liquid silane further comprises a solvent selected from the group of solvents consisting of toluene, xylene, cyclooctane, 1,2,4-trichlorobenzene, dichloromethane and mixtures thereof.

6. A method as recited in claim 1, wherein said liquid silane further comprises a dopant containing an element selected from the group of elements consisting of Ti, V, Cr Mn, Fe, Co, Ni, Zn, Ga, Ge, As, Zr, Nb, Mo, Tc, Ru, Rh, Pd, Ag, Cd, In, Sn, Sb, Hf, Ta, W, Re, Os, Ir, Pt, Au, Hg, Tl, Pb, Bi, Al, Si, P, and B.

7. A method as recited in claim 1, wherein the deposited film is transformed using thermal processing at a temperature from about 150° C. to 300° C. to produce a polysilane-containing film.

8. The method recited in claim 1, wherein the deposited film is transformed using thermal processing at temperatures from about 300° C. to 700° C. to produce amorphous silicon-containing materials.

9. The method as recited in claim 1, wherein the deposited film is transformed using thermal processing at temperatures from about 700° C. to 1200° C. to produce crystalline silicon-containing materials.

\* \* \* \* \*